United States Patent [19]
Beck

[11] 3,955,108
[45] May 4, 1976

[54] TRANSISTOR AMPLIFIER STAGE WITH DEVICE IN ITS TEMPERATURE COMPENSATED BIAS NETWORK USED AS PRELIMINARY AMPLIFIER

[75] Inventor: John Brewer Beck, Indianapolis, Ind.

[73] Assignee: RCA Corporation, New York, N.Y.

[22] Filed: Sept. 15, 1972

[21] Appl. No.: 289,355

[52] U.S. Cl. .............................. 307/297; 307/310; 330/19; 330/22; 330/23
[51] Int. Cl.² ...................... H03K 1/04; H03F 3/343
[58] Field of Search .................. 330/19, 22, 23, 28, 330/33, 38 M; 307/310, 296, 297

[56] References Cited
UNITED STATES PATENTS

| | | | |
|---|---|---|---|
| 3,102,985 | 9/1963 | Hafner et al. | 330/19 X |
| 3,369,187 | 2/1968 | Csicsatka | 330/19 X |

*Primary Examiner*—John Zazworsky
*Attorney, Agent, or Firm*—H. Christoffersen; S. Cohen; A. L. R. Limberg

[57] ABSTRACT

A collector-loaded grounded-emitter transistor amplifier output stage employs a temperature-compensated bias network with an auxiliary transistor having its base electrode supplied quiescent current exclusively through a resistive element connecting the base and collector electrodes. A source of input signal is coupled to the base electrode of the auxiliary transistor by capacitative means and decoupled by resistive means from the collector electrode thereof. The temperature stabilizing auxiliary transistor accordingly provides a preliminary amplification of input signals for application to the base electrode of the output stage amplifier transistor, without use of additional active devices.

1 Claim, 3 Drawing Figures

TRANSISTOR AMPLIFIER STAGE WITH DEVICE IN ITS TEMPERATURE COMPENSATED BIAS NETWORK USED AS PRELIMINARY AMPLIFIER

This invention relates to grounded-emitter transistor amplifiers having temperature-compensated quiescent base-emitter potentials applied thereto to stabilize collector currents against thermal runaway.

More particularly, the invention pertains to such an amplifier where the semiconductor device used to develop the temperature-compensated quiescent base-emitter potential provides a preliminary amplifier.

Figure 1:
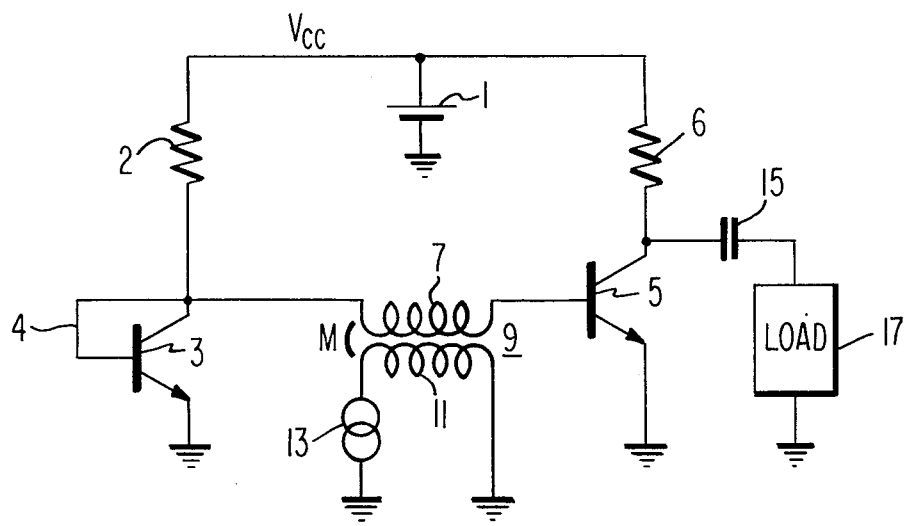
Figure 2:
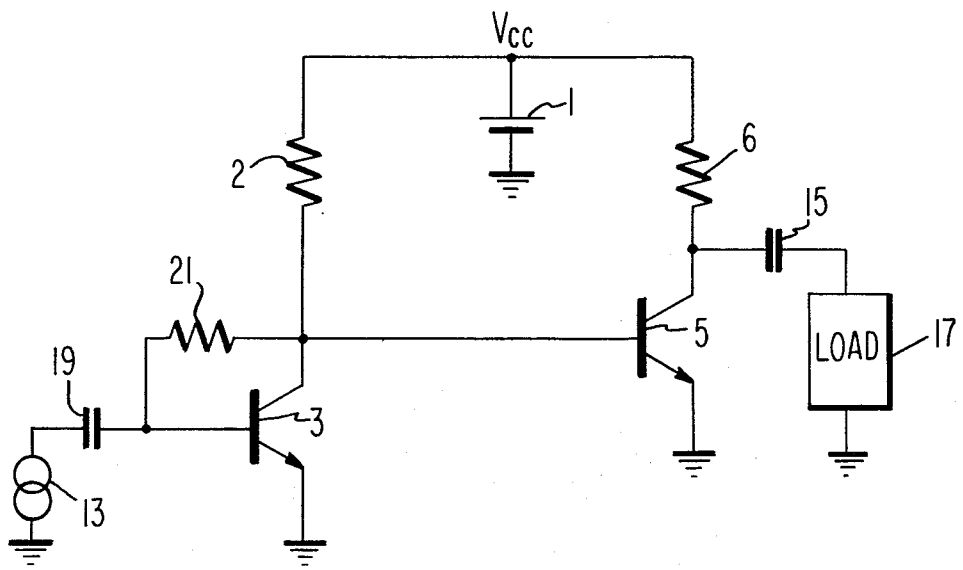

In the accompanying drawing:

FIG. 1 is a circuit diagram of a transistor amplifier stage according to the prior art, and FIG. 2 is a circuit diagram of one embodiment of a transistor circuit according to its present invention.

The stabilization of the operating points of a grounded-emitter transistor stage by applying its quiescent base-emitter potential from a forward-biased semiconductor diode is a common practice. This semiconductor diode is sometimes provided by a transistor having its collector and base electrodes connected to provide one terminal of the diode, the other terminal being at its emitter electrode.

Referring to FIG. 1, the prior art temperature-compensated biasing of a grounded-emitter transistor stage is shown. The battery 1 provides an operating potential $V_{CC}$ impressed across the series combination of resistor 2 and the diode-connected transistor 3. The collector-to-base feedback of transistor 3 afforded by the direct connection 4 between its collector and base electrodes operates to maintain its collector electrode at one base-emitter offset voltage, $V_{BE}$. The $V_{BE}$ for a transistor is fairly constant over a wide range of operating currents and is dependent upon the semiconductor material from which it is made. For example, this is typically 0.5 to 0.7 volts for a silicon transistor. The potential drop across the resistor 2 is well defined as being $V_{CC} - V_{BE}$. Therefore, the collector current $I_{C3}$ of transistor 3 as determined by application of Ohm's Law is as follows:

$$I_{C3} = \frac{V_{CC} - V_{BE3}}{R_2} \qquad (1)$$

where:

$V_{BE3}$ is the base-emitter offset voltage of transistor 3,
$R_2$ is the resistance of resistor 2, and
$V_{CC}$ is the battery potential The transistor 5 has the same base-emitter voltage impressed between its base and emitter terminals as transistor 3. If transistor 5 is similar and shares the same thermal environment as transistor 3, the collector current $I_{C5}$ of transistor 5 will be the same as that of transistor 3.

That is:

$$I_{C5} = \frac{V_{CC} - V_{BE3}}{R_2} \qquad (2)$$

Since $V_{CC}$, $V_{BE3}$ and $R_2$ are each well defined quantities which vary little with temperature and since $V_{BE3}$, which is most likely to show variation with temperature, is generally appreciably smaller than $V_{CC}$, $I_{C5}$ is stably determined and is substantially invariant with temperature. The quiescent collector potential of transistor 5 is determined by the potential drop across the resistor 6 caused by $I_{C5}$. This potential is usually $V_{CC}$ arranged to be a value which is intermediate the potential and ground reference potential.

It will be noted in the application of signals to be amplified in the prior art circuit configuration of FIG. 1, that the transistor 3 does not aid the amplification process. The impedance at the collector electrode of transistor 3 may be defined as:

$$\frac{\Delta V_{BE3}}{\Delta I_{C3}} = \frac{1}{gm_3} \qquad (3)$$

where $gm_3$ is the transconductance of transistor 3. The input impedance of grounded-emitter transistor 5 is known to be:

$$\frac{\beta_5}{gm_5} \qquad (4)$$

where:

$gm_5$ is the transconductance of transistor 5 and equals $gm_3$, since $I_{C3} = I_{C5}$, and $\beta_5$ is the forward current gain of the grounded-emitter transistor 5.

Since $\beta_5$ is normally in excess of 35 or 40, the input impedance of the transistor 5 is proportionately much higher than the collector impedance of diode-connected transistor 3. The collector impedance of transistor 3 is essentially at signal ground for the end of the secondary winding 7 of the input transformer 9 which is remote from the base electrode of transistor 5.

Input signals are coupled from the signal source 13 to the primary winding 11 of the input transformer 9. By the mutual coupling M of the transformer 9, the signals are coupled to the secondary winding 7 of the transformer 9, and applied to the base electrode of transistor 5 to be amplified. The amplified signals are then coupled from the collector electrode of transistor 5 via capacitor 15 to the load 17. The voltage gain G afforded by the transistor devices is due to transistor 5 alone, and it is well known:

$$G = gm_5 R_L \qquad 5$$

where $R_L$ is the impedance of the total collector load of transistor 5.

Referring to FIG. 2, the configuration schematically shown embodies the present invention. In FIG. 2, like numbered elements correspond with those shown and described with respect to FIG. 1.

The source 13 is coupled via a capacitive element 19 to the base electrode of transistor 3. The collector-to-base feedback of transistor 3 includes the resistive element 21. The transistor 3, in addition to applying temperature-compensated quiescent base-emitter potential to transistor 5, is included in the signal amplification path.

For analyzing the provision of temperature-compensated base-emitter potential to transistor 5, the following known equation describing transistor action is of assistance.

$$V_{BE} = \frac{kT}{q} \ln \frac{I_c}{I_s} \qquad (6)$$

where
- $k$ = Boltzmann's constant
- $q$ = charge on an electron
- $T$ = absolute temperature
- $I_s$ = leakage current In the arrangement of FIG. 2, the base-emitter voltage $V_{BE5}$ of transistor 5 is somewhat larger than the base emitter voltage $V_{BE3}$ of transistor 3. This is due to the potential drop across resistance element 21 caused by quiescent base current flow into transistor 3.

From equation (6) above it follows that:

$$V_{BE5} - V_{BE3} = \frac{kT}{q} \ln \frac{I_{c5}}{I_{s5}} - \frac{kT}{q} \ln \frac{I_{c3}}{I_{s3}} \qquad (7)$$

Assuming again the transistors 3 and 5 are similar and in the same thermal environment. Thus, $$I_{s5} = I_{s3} \text{ and} \qquad 8$$

$$V_{BE5} - V_{BE3} = \frac{kT}{q} \ln \frac{I_{c5}}{I_{c3}} \qquad (9)$$

$I_{c3}$ is determined by Ohm's Law to be $(V_{CC} - V_{BE5})/R_2$ and as before is well-defined despite temperature variation, if $V_{CC}$ is appreciably larger than $V_{BE5}$. Therefore, the preceding equation defines $I_{c5}$ as a function of $V_{BE5} - V_{BE3}$.

The required resistance of the resistance element 21, $R_{21}$, to maintain a selected ratio of collector currents $I_{c5}/I_{c3}$ is determined from Ohm's Law. Taking the quiescent base current of transistor 3 to be equal to $I_{c3}/\beta_3$, where $\beta_3$ is the grounded-emitter forward current gain of transistor 3:

$$R_{21} = \frac{V_{BE5} - V_{BE3}}{I_{c3}/\beta_3} = \frac{\beta_3}{I_{c3}} \frac{kT}{q} \ln \frac{I_{c5}}{I_{c3}} \qquad (10)$$

$\beta_3$ increases with temperature. With fixed $R_{21}$, fixed $I_{c3}$ and increasing temperature, $I_{c5}$ must be reduced. This change is in a direction opposite from thermal runaway which is the condition in which collector current increases at an increasing rate with temperature change. The addition of the resistance element 21 provides overcompensation against thermal runaway, which overcompensation is acceptable or desirable in many circuits, as compared to substantially exact compensation afforded when transistor 3 has its base electrode directly connected to its collector electrode.

Figure 3:
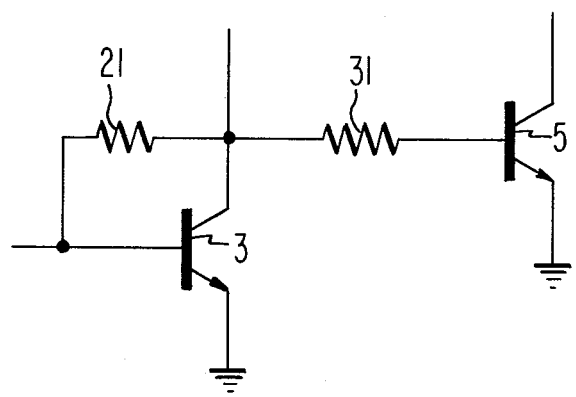

FIG. 3 shows a portion of and corresponds with the circuit shown and described with respect to FIG. 2. In the embodiment of FIG. 3, a resistance element 31 is provided between the collector electrode of transistor 3 and the base electrode of transistor 5. By introducing resistance into the coupling of the collector electrode of transistor 3 to the base electrode of transistor 5, the over-compensation discussed above with regard to FIG. 2 can be reduced, cancelled or overcome. Also, if $I_{c5}/I_{c3}$ be large, the effects of the base current of transistor 5 upon current flow through resistor 2 become more pronounced in comparison with the collector current $I_3$, which reduces, cancels or overcomes the overcompensation.

The contribution of the preliminary amplifier transistor 3 to overall circuit amplification may be calculated, noting that the contribution to gain of transistor 5 is the same in the configurations shown in FIGS. 1 and 2.

The open loop signal voltage gain of the transistor 3 is:

$$G_3 = gm_3 \left( R_2 \| \frac{\beta_5}{gm_5} \right) \qquad (11)$$

where the bracketed term is the parallel combination of $R_2$ and $\beta_5/gm_5$. The closed loop signal voltage gain of the preliminary amplifier transistor 3 can be closely approximated proceeding from the general negative feedback equation:

$$K = \frac{G}{1 = GH} \qquad (12)$$

where
- $K$ is closed loop voltage gain
- $G$ is open loop voltage gain
- $H$ is feedback network voltage gain $$K = \frac{gm_3 \left( R_2 \| \frac{\beta_5}{gm_5} \right)}{1 + \left[ gm_3 \left( R_2 \| \frac{\beta_5}{gm_5} \right) \right] \left[ \frac{R_s + \frac{\beta_3}{gm_3}}{R_{21} + R_s + \frac{\beta_3}{gm_3}} \right]} \qquad (13)$$

This equation can be evaluated for a variety of conditions.

Assume $R_s$, the source impedance of signal source 13, is small compared to $R_{21}$ and the input impedance of transister 3 is $\beta_3/gm_3$ and further assuming $R_2$ is small compared to $R_{21}$ and to the input impedance of transistor 5, which is $\beta_5/gm_5$, then $$K = gm_3 R_2. \qquad 14$$

That is, the full-grounded emitter voltage gain of transistor 3 is realized.

In the claims which follow, the expression "directly connected", referring to the connection of the emitter electrode to a point of reference potential, means a connection without an intervening element of substantial impedance. The connection is such that no or substantially no degeneration of quiescent current variations will occur in the emitter connection.

What is claimed is:

1. In a direct coupled cascade connection before an output grounded-emitter transistor amplifier stage including a transistor having a base electrode, having an emitter electrode directly connected to a point of reference potential and having a collector electrode coupled through a first resistive means of given value to a source of operating potential, an input grounded-emitter transistor amplifier stage for temperature stabilizing the quiescent collector current of said transistor, said input common-emitter transistor amplifier stage comprising:

a further transistor having a collector electrode, having an emitter electrode directly connected to said point of reference potential, and having a base electrode for receiving an input signal applied for causing an output signal at the collector electrode of said transistor included in said output grounded-emitter transistor amplifier stage, which output signal is related over at least a portion of its range substantially linearly with said input signal;

means for direct current coupling the collector electrode of said further transistor to the base electrode of the transistor within said output grounded-emitter transistor amplifier stage to apply amplified input signal thereto;

second resistive means coupling the collector electrode of said further transistor to said source of operating potential; and third resistive means connected between said collector and base electrodes of said further transistor and providing substantially the sole direct current conductive path external of said further transistor connected to the base electrode of said further transistor and wherein:

said means for coupling the collector electrode of said further transistor to the base electrode of said transistor stage includes fourth resistive means of a value offsetting the temperature compensation provided by the arrangement of said third resistive means and said further transistor.

* * * * *

UNITED STATES PATENT OFFICE
CERTIFICATE OF CORRECTION

PATENT NO. : 3,955,108
DATED : May 4, 1976
INVENTOR(S) : John Brewer Beck

It is certified that error appears in the above-identified patent and that said Letters Patent are hereby corrected as shown below:

Column 1, line 40, "$V_{CC}-V_{BE}$" should read --$V_{CC}-V_{BE}$--.

Column 2, equation (3), should read $$-- \frac{\Delta V_{BE3}}{\Delta I_{C3}} = \frac{1}{gm_3} --$$

Column 2, equation (5), equation number should be in parenthesis.

Column 3, equation (8), should read --$I_{S5} = I_{S3}$-- and equation number should be in parenthesis.

Column 4, equation (11), should read $$-- G_3 = gm_3 \left( R_2 \parallel \frac{\beta_5}{gm_5} \right) --$$

Column 4, equation (12), should read --$K = \frac{G}{1+GH}$--

Column 4, equation (14), equation number should be in parenthesis.

Signed and Sealed this

Twenty-seventh Day of July 1976

[SEAL]

Attest:

RUTH C. MASON
*Attesting Officer*

C. MARSHALL DANN
*Commissioner of Patents and Trademarks*